(12) United States Patent
Lee

(10) Patent No.: US 8,692,257 B2
(45) Date of Patent: Apr. 8, 2014

(54) DISPLAY APPARATUS AND METHOD OF MANUFACTURING THE DISPLAY APPARATUS

(75) Inventor: Kyung-Jun Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 281 days.

(21) Appl. No.: 13/212,601

(22) Filed: Aug. 18, 2011

(65) Prior Publication Data

US 2012/0138979 A1 Jun. 7, 2012

(30) Foreign Application Priority Data

Dec. 3, 2010 (KR) .................... 10-2010-0122675

(51) Int. Cl.
*H01L 27/144* (2006.01)

(52) U.S. Cl.
USPC ...... 257/72; 257/E51.001; 438/455; 438/456; 445/25

(58) Field of Classification Search
None
See application file for complete search history.

(56) References Cited

U.S. PATENT DOCUMENTS

| | | |
|---|---|---|
| 2007/0170605 A1 | 7/2007 | Lee et al. |
| 2007/0170861 A1 | 7/2007 | Lee et al. |
| 2007/0232182 A1 | 10/2007 | Park |
| 2008/0012476 A1* | 1/2008 | Kim et al. ............ 313/504 |
| 2008/0110561 A1* | 5/2008 | Lee et al. ............ 156/275.3 |
| 2009/0009046 A1* | 1/2009 | Oh et al. ............ 313/1 |
| 2009/0058292 A1* | 3/2009 | Koo et al. ............ 313/512 |
| 2009/0134782 A1 | 5/2009 | Kim |
| 2011/0008593 A1* | 1/2011 | Abbott et al. ............ 428/203 |

FOREIGN PATENT DOCUMENTS

| | | |
|---|---|---|
| KR | 10-0671644 B1 | 1/2007 |
| KR | 10-0732817 B1 | 6/2007 |
| KR | 10-2007-0077010 A | 7/2007 |
| KR | 10-2008-0042321 A | 5/2008 |
| KR | 10-0903622 B1 | 6/2009 |

* cited by examiner

*Primary Examiner* — Fei Fei Yeung Lopez
(74) *Attorney, Agent, or Firm* — Lee & Morse, P.C.

(57) ABSTRACT

Present embodiments provide a display apparatus including a substrate; a sealing substrate facing the substrate; a display unit between the substrate and the sealing substrate; a first sealing member between the substrate and the sealing substrate to be spaced apart from the display unit, so as to bond the substrate and the sealing substrate to each other; a second sealing member between the substrate and the sealing substrate to be spaced apart from the display unit and the first sealing member, so as to bond the substrate and the sealing substrate to each other; and a light pattern layer on a surface of the sealing substrate opposite to a surface facing the display unit, so as to adjust light intensity transmitted through the sealing substrate. The light pattern layer includes a first pattern corresponding to the first sealing member and a second pattern corresponding to the second sealing member.

24 Claims, 7 Drawing Sheets

US 8,692,257 B2

DISPLAY APPARATUS AND METHOD OF MANUFACTURING THE DISPLAY APPARATUS

CROSS-REFERENCE TO RELATED PATENT APPLICATION

This application claims the benefit of Korean Patent Application No. 10-2010-0122675, filed on Dec. 3, 2010, in the Korean Intellectual Property Office, the disclosure of which is incorporated herein in its entirety by reference.

BACKGROUND

1. Field

Embodiments relate to a display apparatus and a method of manufacturing the display apparatus. More particularly, embodiments relate to a display apparatus capable of improving durability, and a method of manufacturing the display apparatus.

2. Description of the Related Art

Display apparatuses are being replaced by portable thin flat panel display apparatuses. In particular, flat panel display apparatuses, such as an organic light-emitting display apparatus and a liquid crystal display apparatus, have excellent image quality characteristics.

SUMMARY

Present embodiments may provide a display apparatus.

According to an aspect of present embodiments, there is provided a display apparatus including a substrate; a sealing substrate facing the substrate; a display unit between the substrate and the sealing substrate; a first sealing member between the substrate and the sealing substrate, the first sealing member spaced apart from the display unit, the first sealing member bonding the substrate and the sealing substrate to each other; a second sealing member between the substrate and the sealing substrate, the second sealing member spaced apart from the display unit and the first sealing member, the second sealing member bonding the substrate and the sealing substrate to each other; and a light pattern layer on a surface of the sealing substrate, opposite to a surface facing the display unit, the light pattern layer adjusting light intensity transmitted through the sealing substrate, wherein the light pattern layer includes a first pattern corresponding to the first sealing member and a second pattern corresponding to the second sealing member.

The light pattern layer may further include a light blocking unit in a peripheral region of the first pattern and a peripheral region of the second pattern.

The first pattern and the second pattern may be spaced apart from each other, and the light pattern layer may further include a light blocking unit in a region between the first pattern and the second pattern.

The first pattern may be an opening.

The second pattern may be a semi light-transmissive pattern for partially transmitting light incident on the sealing substrate.

The second pattern may include slits or may include a semi light-transmissive material.

The second pattern may be an opening.

The first sealing member may include frit, and the second sealing member may include resin.

The second sealing member may be spaced apart from the display unit by a distance greater than a distance by which the first sealing member is spaced apart from the display unit.

The display unit may include an organic light-emitting device or a liquid crystal device.

According to another aspect of present embodiments, there is provided a method of manufacturing a display apparatus, the method including disposing a display unit between a substrate and a sealing substrate facing the substrate; disposing, between the substrate and the sealing substrate, a first preliminary sealing member spaced apart from the display unit, and a second preliminary sealing member spaced apart from the display unit and the first preliminary sealing member; and irradiating a laser beam onto an upper surface of the sealing substrate to melt and cure the first and second preliminary sealing members, to form first and second sealing members, and to bond the substrate and the sealing substrate to each other, wherein a light pattern layer, including a first pattern corresponding to the first preliminary sealing member and a second pattern corresponding to the second preliminary sealing member, is on a surface of the sealing substrate facing the laser beam.

The light pattern layer may further include a light blocking unit in a peripheral region of the first pattern and a peripheral region of the second pattern.

The first pattern and the second pattern may be spaced apart from each other, and the light pattern layer may further include a light blocking unit in a region between the first pattern and the second pattern.

The first pattern may be an opening.

The second pattern may be a semi light-transmissive pattern for partially transmitting light incident on the sealing substrate.

The second pattern may include slits or includes a semi light-transmissive material.

Irradiating the laser beam may include irradiating a laser beam corresponding to a whole region of the first pattern and the second pattern.

The second pattern may be an opening.

Irradiating the laser beam may include irradiating a laser beam corresponding to the first pattern and irradiating a laser beam corresponding to the second pattern.

The first sealing member may include frit, and the second sealing member may include resin.

The second sealing member may be spaced apart from the display unit by a distance greater than a distance by which the first sealing member is spaced apart from the display unit.

The display unit may include an organic light-emitting device or a liquid crystal device.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION

Korean Patent Application No. 10-2010-0122675, filed on Dec. 3, 2010, in the Korean Intellectual Property Office, and entitled "Display Apparatus and Method of Manufacturing the Display Apparatus," is incorporated by reference herein in its entirety.

The inventive concept will now be described more fully hereinafter with reference to the accompanying drawings, in which exemplary embodiments of the inventive concept are illustrated. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Figure 1:
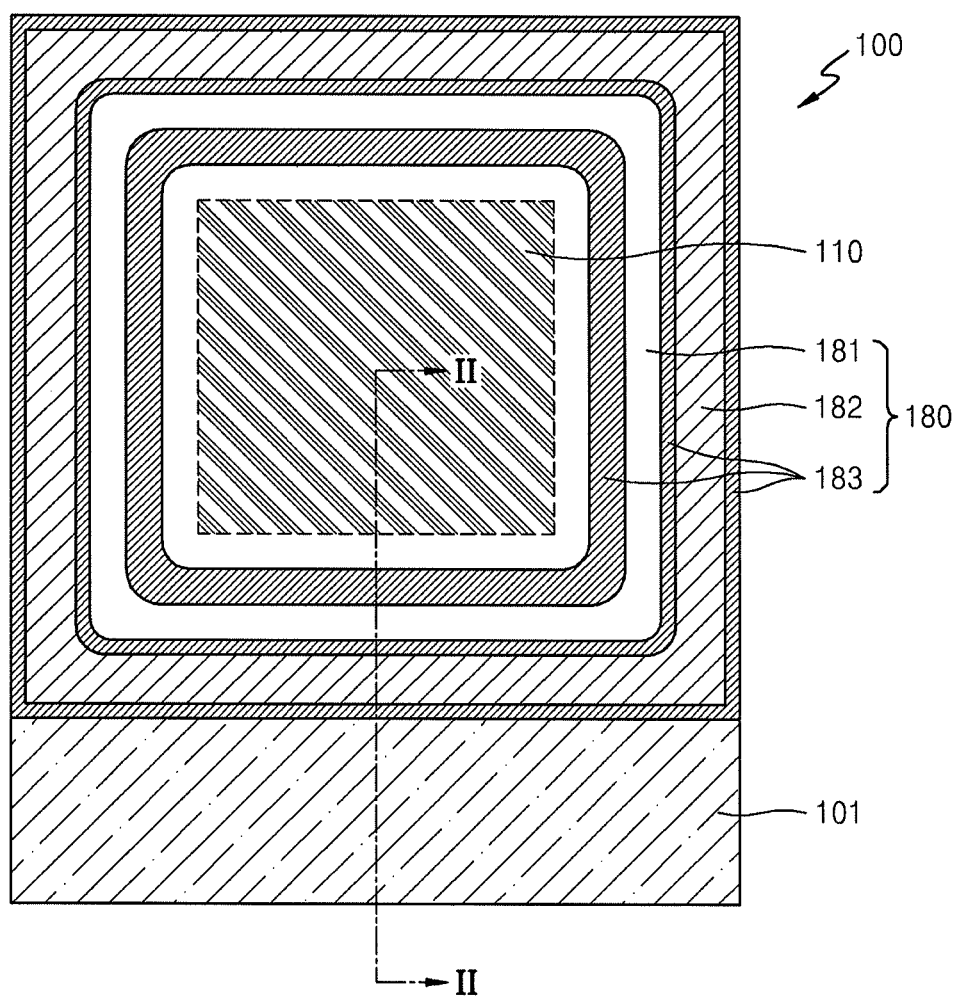
FIG. 1 is a plane view of a display apparatus according to an embodiment.
Figure 2:
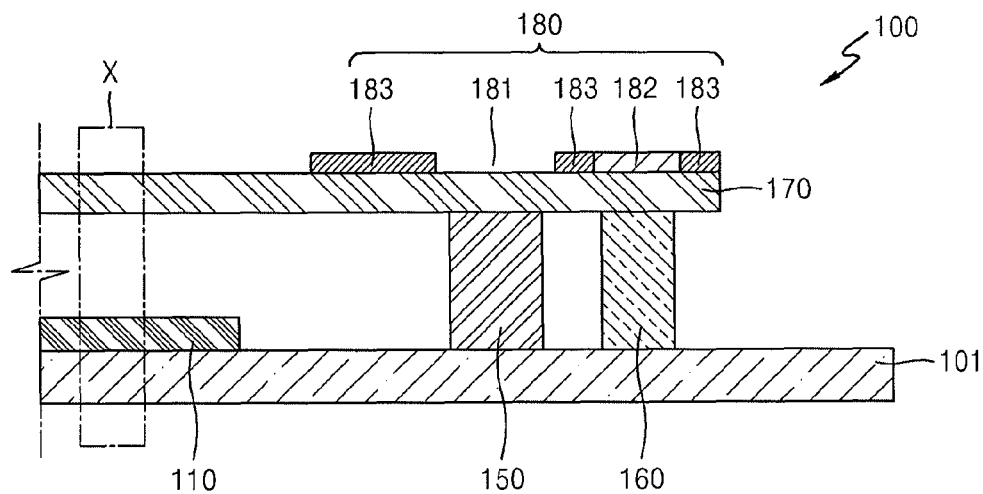
FIG. 2 is a cross-sectional view cut along a line II-II of FIG. 1.
Figure 3:
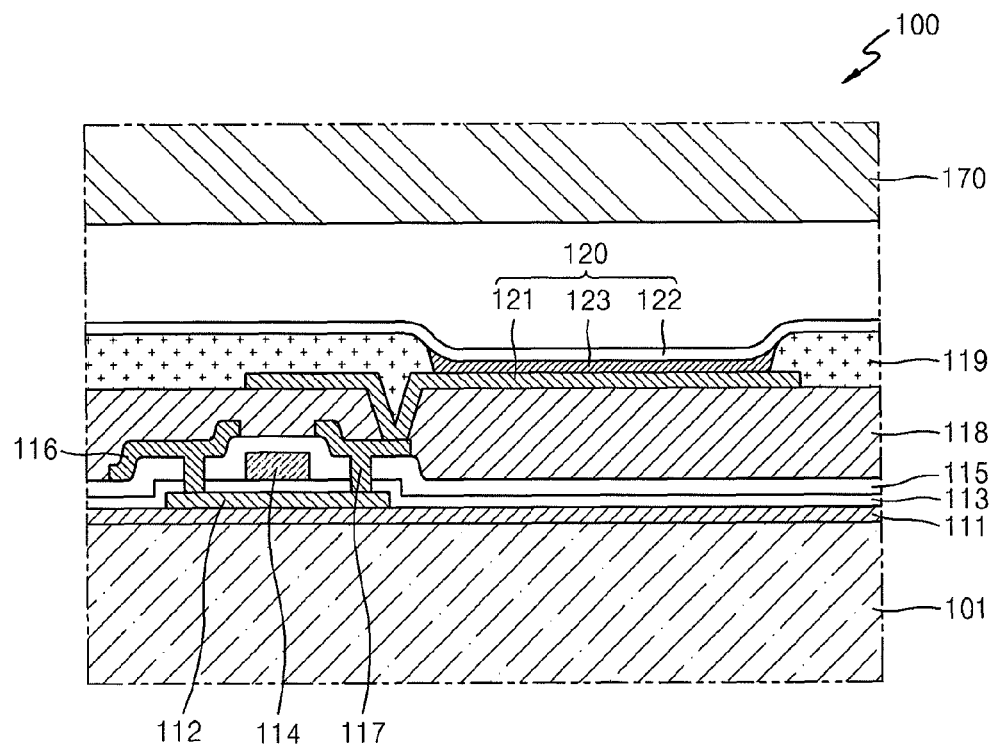
FIG. 3 is a magnified view of a portion X of FIG. 2.

FIG. 1 is a plane view of a display apparatus 100 according to an embodiment. FIG. 2 is a cross-sectional view cut along a line II-II of FIG. 1. FIG. 3 is a magnified view of a portion X of FIG. 2

Referring to FIGS. 1 through 3, the display apparatus 100 includes a substrate 101, a display unit 110, a sealing substrate 170, a first sealing member 150, a second sealing member 160, and a light pattern layer 180. The light pattern layer 180 includes a first pattern 181, a second pattern 182, and a light blocking unit 183.

The substrate 101 may be formed of a transparent glass material, including $SiO_2$. However, the substrate 101 is not limited thereto. The substrate 101 may be formed of a transparent plastic material. In this case, the transparent plastic material for forming the substrate 101 may be an insulating organic material, e.g., polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

The display unit 110 is disposed on the substrate 101. The display unit 110 may be of various types. The display unit 110 includes an organic light-emitting device in FIGS. 1 through 3. However, the display unit 110 is not limited thereto. The display unit 110 may include a liquid crystal device.

The sealing substrate 170 is disposed facing the display unit 110. The sealing substrate 170 protects the display unit 110 from external moisture or oxygen. The sealing substrate 170 may be formed of various materials, e.g., a glass material or a plastic material for transmitting a laser beam.

The substrate 101 and the sealing substrate 170 are bonded to each other by the first and second sealing members 150 and 160. The first sealing member 150 is formed around the display unit 110 to be spaced apart from the display unit 110. The second sealing member 160 is formed around the first sealing member 150 to be spaced apart from the display unit 110 and the first sealing member 150. However, the second sealing member 160 is not limited thereto. The second sealing member 160 may be formed at one side of the first sealing member 150 to be spaced apart from the first sealing member 150.

The first sealing member 150 contains frit. The second sealing member 160 contains resin. More particularly, the second sealing member 160 contains epoxy resin. Together with the first sealing member 150, the second sealing member 160 improves bonding characteristics between the substrate 101 and the sealing substrate 170. Accordingly, the durability of the display apparatus 100 may be improved.

The light pattern layer 180 is formed on an upper surface of the sealing substrate 170, i.e., a surface of the sealing substrate 170 opposite to a surface facing the display unit 110.

The light pattern layer 180 includes the first pattern 181, the second pattern 182, and the light blocking unit 183. The first pattern 181 is formed to correspond to the first sealing member 150. The first pattern 181 has a width equal to or slightly greater than the width of the first sealing member 150. The first pattern 181 is formed as an opening.

The second pattern 182 is formed to correspond to the second sealing member 160. The second pattern 182 has a width equal to or slightly greater than the width of the second sealing member 160. The second pattern 182 is a semi light-transmissive pattern for partially transmitting and partially blocking light. The second pattern 182 may include a plurality of slits to function as a semi light-transmissive pattern. However, the second pattern 182 is not limited thereto. The second pattern 182 may be formed of a semi light-transmissive material to function as a semi light-transmissive pattern.

The light blocking unit 183 is formed in a peripheral region of the first pattern 181 and a peripheral region of the second pattern 182. The first and second patterns 181 and 182 are spaced apart from each other. The light blocking unit 183 is also formed in the space between the first and second patterns 181 and 182. The light blocking unit 183 may contain metal. However, the light blocking unit 183 is not limited thereto. The light blocking unit 183 may contain various materials for blocking light. More particularly, the light blocking unit 183 may contain a laser beam.

The display unit 110 uses an organic light-emitting device in FIGS. 1 through 3. The display unit 110 is described in detail with reference to FIG. 3.

The display unit 110 may be of various types. In the current embodiment, the display unit 110 is an organic light-emitting device.

Referring to FIG. 3, a buffer layer 111 is formed on the substrate 101. The buffer layer 111 may provide a flat surface on the substrate 101. The buffer layer 111 may prevent penetration of moisture and impurities into the substrate 101.

An active layer 112 having a predetermined pattern is formed on the buffer layer 111. The active layer 112 may be formed of an organic semiconductor or an inorganic semiconductor, e.g., amorphous silicon or polysilicon. The active layer 112 may include a source region, a drain region, and a channel region.

The source and drain regions may be formed by doping the active layer 112, formed of amorphous silicon or polysilicon, with an impurity. A p-type semiconductor may be obtained if the active layer 112 is doped with a group III element, i.e., boron (B). An n-type semiconductor may be obtained if the active layer 112 is doped with a group V element, i.e., nitrogen (N).

A gate insulating layer 113 is formed on the active layer 112. A gate electrode 114 is formed on a predetermined region of the gate insulating layer 113. The gate insulating layer 113 is used to insulate the active layer 112 from the gate electrode 114. The gate insulating layer 113 may be formed of an organic material or an inorganic material, e.g., SiNx or $SiO_2$.

The gate electrode 114 may be formed of a metal, e.g., gold (Au), silver (Ag), copper (Cu), nickel (Ni), platinum (Pt), palladium (Pd), aluminum (Al), molybdenum (Mo), or a metal alloy, e.g., an Al:Nd alloy or a Mo:W alloy. However, the gate electrode 114 is not limited thereto. The gate electrode 114 may be formed of various materials in consideration of adhesion, planarization, electric resistance, processability, and so on. The gate electrode 114 is connected to a gate line (not shown) for applying an electrical signal.

An interlayer insulating layer 115 is formed on the gate electrode 114. The interlayer insulating layer 115 and the gate insulating layer 113 are formed, exposing the source and drain regions of the active layer 112. Thus, a source electrode 116 and a drain electrode 117 contact the exposed source and drain regions, respectively, of the active layer 112.

The source and drain electrodes 116 and 117 may be formed of a metal such as Au, Pd, Pt, Ni, rhodium (Rh), ruthenium (Ru), iridium (Ir), osmium (Os), Al, Mo, or a metal alloy, e.g., an Al:Nd alloy or an MoW alloy. However, the source and drain electrodes 116 and 117 are not limited thereto.

A passivation layer 118 is formed covering the source and drain electrodes 116 and 117. The passivation layer 118 may be formed as an inorganic insulating layer and/or an organic insulating layer. The inorganic insulating layer may be formed of $SiO_2$, SiNx, SiON, $Al_2O_3$, $tiO_2$, $ta_2O_5$, $HfO_2$, $ZrO_2$, barium strontium titanate (BST), or lead zirconate titanate (PZT). The organic insulating layer may be formed of a general-use polymer such as polymethylmethacrylate (PMMA) or polystyrene (PS), a polymer derivative containing a phenol group, an acryl-based polymer, an imide-based polymer, an arylether-based polymer, an amide-based polymer, a fluorine-based polymer, a p-xylene-based polymer, a vinyl alcohol-based polymer, or a mixture thereof. The passivation layer 118 may be a stack of the organic and inorganic insulating layers.

The passivation layer 118 is formed exposing the drain electrode 117. An organic light-emitting device 120 is formed to be connected to the exposed drain electrode 117. The organic light-emitting device 120 includes a first electrode 121, a second electrode 122, and an intermediate layer 123. The first electrode 121 contacts the drain electrode 117.

The intermediate layer 123 includes an organic emission layer (not shown) and generates visible light if a voltage is applied to the first and second electrodes 121 and 122.

A pixel defining layer 119 is formed on the first electrode 121 by using an insulator. A predetermined opening is formed in the pixel defining layer 119 to expose the first electrode 121. The intermediate layer 123 is formed on the exposed first electrode 121. The second electrode 122 is formed to be connected to the intermediate layer 123.

The first and second electrodes 121 and 122 have polarities of an anode and a cathode, respectively, or vice-versa.

The sealing substrate 170 is disposed on or above the second electrode 122.

The display apparatus 100, according to the current embodiment, includes the first and second sealing members 150 and 160. Since the second sealing member 160 containing resin reinforces the first sealing member 150 containing frit, bonding characteristics between the substrate 101 and the sealing substrate 170 may be improved. Accordingly, the durability of the display apparatus 100 may be improved.

In the display apparatus 100, because the light pattern layer 180 is formed on an upper surface of the sealing substrate 170, and the first and second sealing members 150 and 160 are formed by irradiating a laser beam without using an additional mask, a bonding process may be simplified. The light pattern 180 may include the first pattern 181, corresponding to the first sealing member 150, and the second pattern 182, corresponding to the second sealing member 160. In order to form the first and second sealing members 150 and 160, a material for forming the first sealing member 150 and a material for forming the second sealing member 160 is disposed. A mask is disposed on the materials. A laser beam is irradiated, to perform melting and curing processes. However, in the current embodiment, without using an additional mask, the first and second sealing members 150 and 160 may be formed by irradiating a laser beam one time.

Defects occurring in a bonding process between the substrate 101 and the sealing substrate 170 may be prevented. Therefore, bonding characteristics between the substrate 101 and the sealing substrate 170 may be improved. Since a laser beam is irradiated one time, defects caused when the laser beam is irradiated a plurality of times may be reduced. Thus, characteristics of the first and second sealing members 150 and 160 may be improved.

In the display apparatus 100, since the light pattern layer 180 is formed on the sealing substrate 170, the sealing substrate 170 and the light pattern layer 180 may not be spaced apart. The sealing substrate 170 and the light pattern layer 180 may be bonded to each other. Since the sealing substrate 170 and the light pattern layer 180 are bonded, a laser beam may be irradiated on a desired pattern without dislocation. Accordingly, a laser beam, that reaches the first and second sealing members 150 and 160, may be easily controlled.

FIGS. 4A through 4E are sequential cross-sectional views for describing a method of manufacturing the display apparatus 100 illustrated in FIG. 1.

Figure 4A:
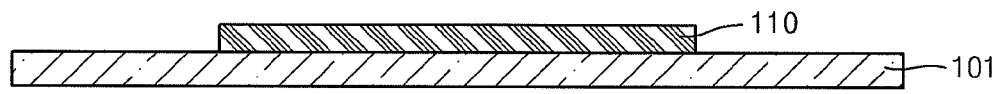
FIGS. 4A through 4E are sequential cross-sectional views for describing a method of manufacturing the display apparatus illustrated in FIG. 1, according to an embodiment.

Referring to FIG. 4A, the display unit 110 is disposed on the substrate 101. A material for forming the substrate 101 is described above in relation to FIGS. 1 through 3. Thus, there is no description here. The display unit 110 may be of various types. For example, the display unit 110 may include an organic light-emitting device or a liquid crystal device.

Figure 4B:
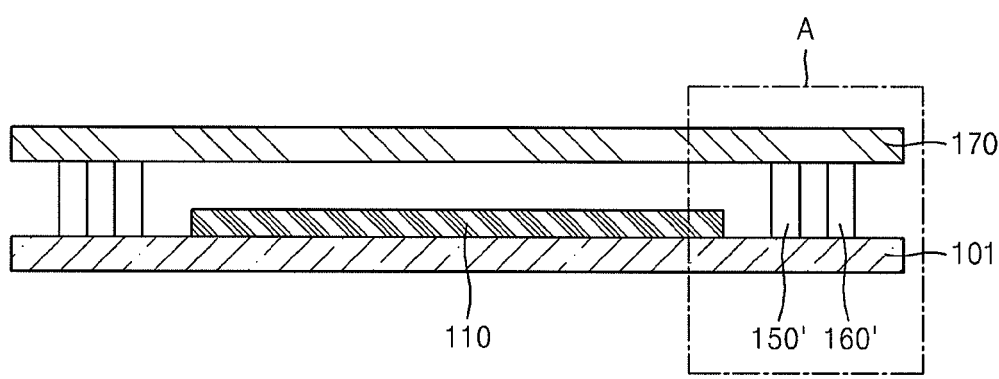
Figure 4C:
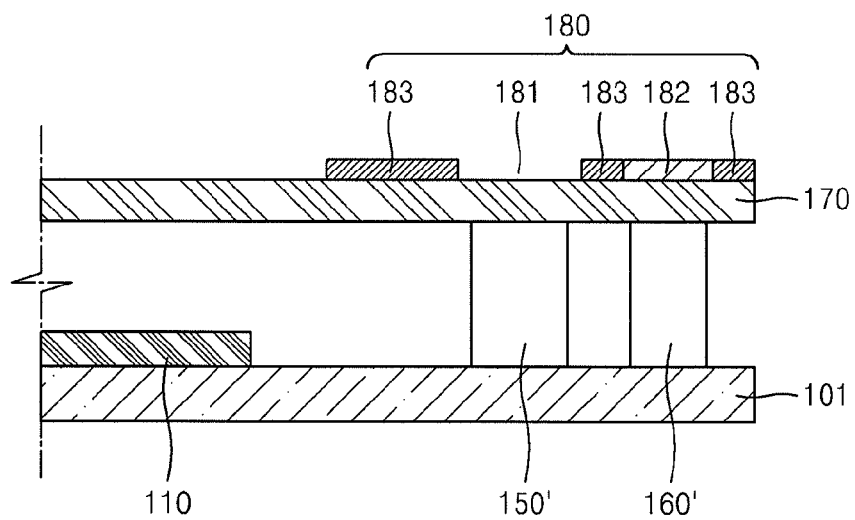

Referring to FIGS. 4B and 4C, the sealing substrate 170 is disposed facing the display unit 110. FIG. 4C is a magnified view of a portion A of FIG. 4B. A first preliminary sealing member 150' and a second preliminary sealing member 160' are formed between the substrate 101 and the sealing substrate 170, to be spaced apart from the display unit 110.

The first preliminary sealing member 150' contains frit. The first preliminary sealing member 150' is formed by applying a frit paste. Then, a curing and drying process is performed.

The second preliminary sealing member 160' contains resin. More particularly, the second preliminary sealing member 160' contains epoxy resin.

The light pattern layer 180 is formed on an upper surface of the sealing substrate 170, i.e., a surface of the sealing substrate 170 opposite to a surface facing the display unit 110.

The light pattern layer 180 includes the first pattern 181, the second pattern 182, and the light blocking unit 183. The first pattern 181 is formed to correspond to the first preliminary sealing member 150'. The first pattern 181 has a width equal to or slightly greater than the width of the first preliminary sealing member 150'. Accordingly, in a subsequent process, a laser beam may easily reach a whole region of the first preliminary sealing member 150'. The first pattern 181 is formed as an opening.

The second pattern 182 is formed to correspond to the second preliminary sealing member 160'. The second pattern 182 has a width equal to or slightly greater than the width of the second preliminary sealing member 160'. Accordingly, in a subsequent process, a laser beam may reach a whole region of the second preliminary sealing member 160'. The second pattern 182 is a semi light-transmissive pattern, for partially transmitting light. The second pattern 182 may include a plurality of slits to function as a semi light-transmissive pattern. However, the second pattern 182 is not limited thereto.

The second pattern 182 may be formed of a semi light-transmissive material to function as a semi light-transmissive pattern.

The light blocking unit 183 is formed in a peripheral region of the first pattern 181 and a peripheral region of the second pattern 182. The first and second patterns 181 and 182 are spaced apart from each other. The light blocking unit 183 is also formed in the space between the first and second patterns 181 and 182. The light blocking unit 183 may contain metal. However, the light blocking unit 183 is not limited thereto. The light blocking unit 183 may contain various materials for blocking light. More particularly, the light blocking unit 183 may contain a laser beam.

Figure 4D:
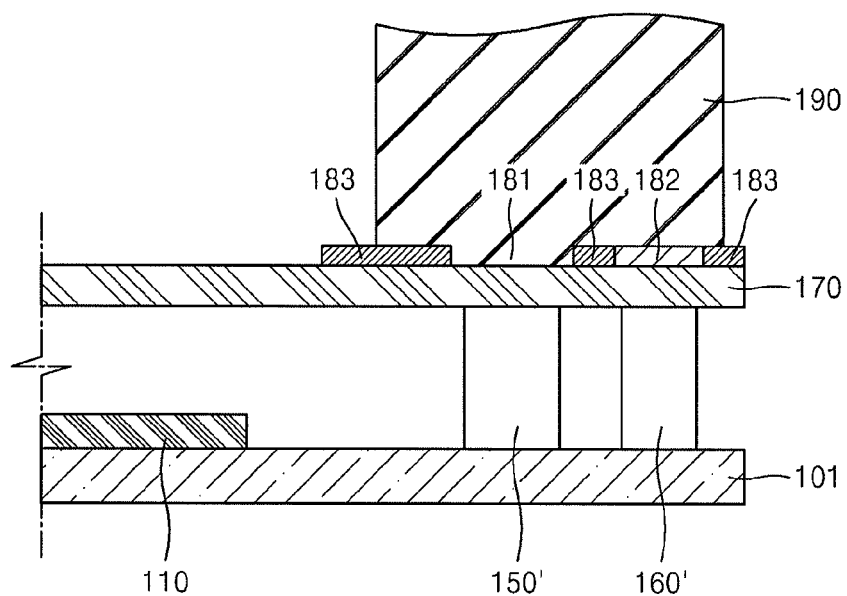

Referring to FIG. 4D, a laser beam 190 is irradiated onto the upper surface of the sealing substrate 170. The laser beam 190 has a width at least corresponding to a whole region of the first and second patterns 181 and 182. The laser beam 190 is transmitted through the first pattern 181 formed as an opening, passes through the sealing substrate 170, and reaches the first preliminary sealing member 150'. The laser beam 190 is partially transmitted through the second pattern 182, passes through the sealing substrate 170, and reaches the second preliminary sealing member 160'. An energy value of the laser beam 190 received by the first preliminary sealing member 150' is greater than the energy value of the laser beam 190 received by the second preliminary sealing member 160'.

Energy required to melt frit contained in the first preliminary sealing member 150' is greater than the energy required to melt resin contained in the second preliminary sealing member 160'. Due to the first and second patterns 181 and 182 of the light pattern layer 180, the first preliminary sealing member 150' receives greater energy of the laser beam 190 than that received by the second preliminary sealing member 160'.

Figure 4E:
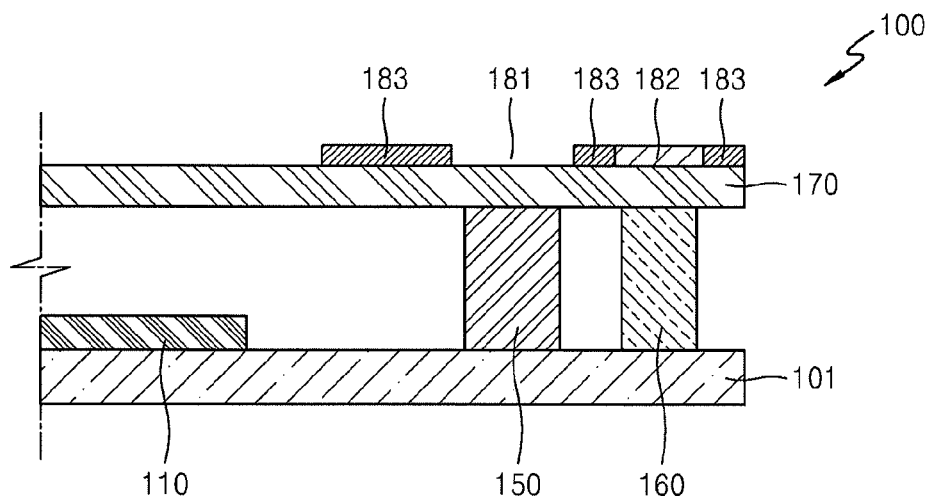

Referring to FIG. 4E, the first and second preliminary sealing members 150' and 160' are melted due to the irradiated laser beam 190, and cured to form the first and second sealing members 150 and 160. Accordingly, the substrate 101 and the sealing substrate 170 are bonded to each other. The display apparatus 100 is ultimately formed.

The display apparatus 100, according to the current embodiment, includes the first and second sealing members 150 and 160. Since the second sealing member 160 containing resin reinforces the first sealing member 150 containing frit, bonding characteristics between the substrate 101 and the sealing substrate 170 may be improved. Accordingly, the durability of the display apparatus 100 may be improved.

The display apparatus 100 may not require an additional mask to irradiate a laser beam to form the first and second sealing members 150 and 160. When a laser beam is irradiated, damage of the sealing substrate 170 caused by contact and alignment between a mask and the sealing substrate 170 may be prevented. Defects in bonding between the substrate 101 and the sealing substrate 170, caused by an undesired irradiating pattern of a laser beam due to inaccurate alignment between a mask and the sealing substrate 170, may be prevented.

The first and second sealing members 150 and 160, having different characteristics, may be easily formed by irradiating a laser beam one time. Thus, manufacturing processes may be reduced.

Figure 5:
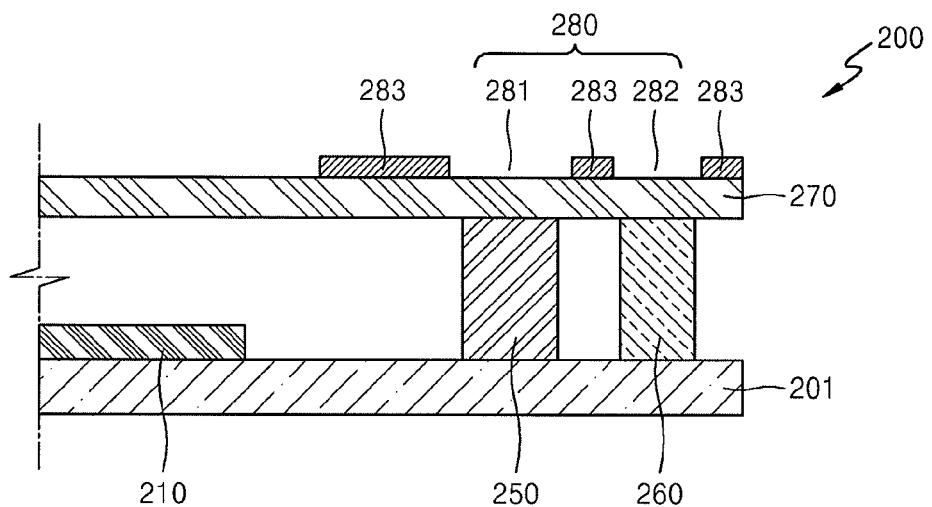
FIG. 5 is a cross-sectional view of a display apparatus according to another embodiment.

FIG. 5 is a cross-sectional view of a display apparatus 200 according to another embodiment. For convenience, differences from the display apparatus 100 illustrated in FIGS. 1 through 3 are described.

Referring to FIG. 5, the display apparatus 200 includes a substrate 201, a display unit 210, a sealing substrate 270, a first sealing member 250, a second sealing member 260, and a light pattern layer 280. The light pattern layer 280 includes a first pattern 281, a second pattern 282, and a light blocking unit 283.

The display unit 210 is disposed on the substrate 201. The display unit 210 may be of various types. For example, the display unit 210 may include an organic light-emitting device or a liquid crystal device.

The sealing substrate 270 is disposed facing the display unit 210. The sealing substrate 270 protects the display unit 210 from external moisture or oxygen. The sealing substrate 270 may be formed of various materials, e.g., a glass material or a plastic material for transmitting a laser beam.

The substrate 201 and the sealing substrate 270 are bonded to each other by the first and second sealing members 250 and 260. The first sealing member 250 is formed around the display unit 210 to be spaced apart from the display unit 210. The second sealing member 260 is formed around the first sealing member 250 to be spaced apart from the display unit 210 and the first sealing member 250. However, the second sealing member 260 is not limited thereto. The second sealing member 260 may be formed at one side of the first sealing member 250 to be spaced apart from the first sealing member 250.

The first sealing member 250 contains frit. The second sealing member 260 contains resin. More particularly, the second sealing member 260 may contain epoxy resin. Together with the first sealing member 250, the second sealing member 260 improves bonding characteristics between the substrate 201 and the sealing substrate 270. Accordingly, the durability of the display apparatus 200 may be improved.

The light pattern layer 280 is formed on an upper surface of the sealing substrate 270, i.e., a surface of the sealing substrate 270 opposite to a surface facing the display unit 210.

The light pattern layer 280 includes the first pattern 281, the second pattern 282, and the light blocking unit 283. The first pattern 281 is formed to correspond to the first sealing member 250. The first pattern 281 has a width equal to or slightly greater than the width of the first sealing member 250. The first pattern 281 is formed as an opening.

The second pattern 282 is formed to correspond to the second sealing member 260. The second pattern 282 has a width equal to or slightly greater than the width of the second sealing member 260. The second pattern 282 is formed as an opening.

The light blocking unit 283 is formed in a peripheral region of the first pattern 281 and a peripheral region of the second pattern 282. The first and second patterns 281 and 282 are spaced apart from each other. The light blocking unit 283 is also formed in the space between the first and second patterns 281 and 282.

The display apparatus 200, according to the current embodiment, includes the first and second sealing members 250 and 260. Since the second sealing member 260, containing resin, reinforces the first sealing member 250 containing frit, bonding characteristics between the substrate 201 and the sealing substrate 270 may be improved. Accordingly, the durability of the display apparatus 200 may be improved.

In the display apparatus 200, since the light pattern layer 280 is formed on an upper surface of the sealing substrate 270, and the first and second sealing members 250 and 260 are formed by irradiating a laser beam without using an additional mask, a bonding process may be simplified. The light pattern layer 280 may include the first pattern 281, corresponding to the first sealing member 250, and the second pattern 282, corresponding to the second sealing member 260. Accordingly, defects occurring in a bonding process between the substrate 201 and the sealing substrate 270 may be prevented. Thus, bonding characteristics between the substrate 201 and the sealing substrate 270 may be improved.

In the display apparatus 200, since the light pattern layer 280 is formed on the sealing substrate 270, the sealing substrate 270 and the light pattern layer 280 may not be spaced apart. The sealing substrate 270 and the light pattern layer 280 may be bonded to each other. Since the sealing substrate 270 and the light pattern layer 280 are bonded, a laser beam may be irradiated on a desired pattern without dislocation. Accordingly, a laser beam, that reaches the first and second sealing members 250 and 260, may be easily controlled.

According to an embodiment, FIGS. 6A through 6E are sequential cross-sectional views for describing a method of manufacturing the display apparatus 200 illustrated in FIG. 5.

Figure 6A:
FIGS. 6A through 6E are sequential cross-sectional views for describing a method of manufacturing the display apparatus illustrated in FIG. 5, according to an embodiment.

Referring to FIG. 6A, the display unit 210 is disposed on the substrate 201. A material for forming the substrate 201 is the same as the material for forming the substrate 101 illustrated in FIGS. 2 through 3. Thus, there is no description of the material here. The display unit 210 may be of various types. For example, the display unit 210 may include an organic light-emitting device or a liquid crystal device.

Figure 6B:
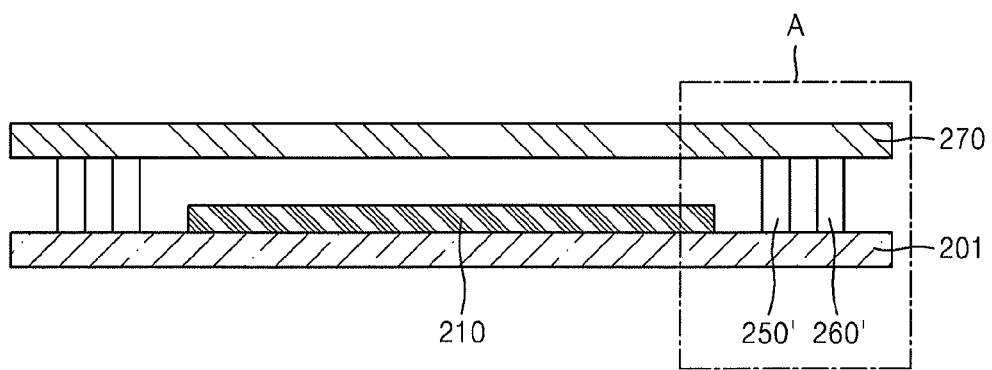
Figure 6C:
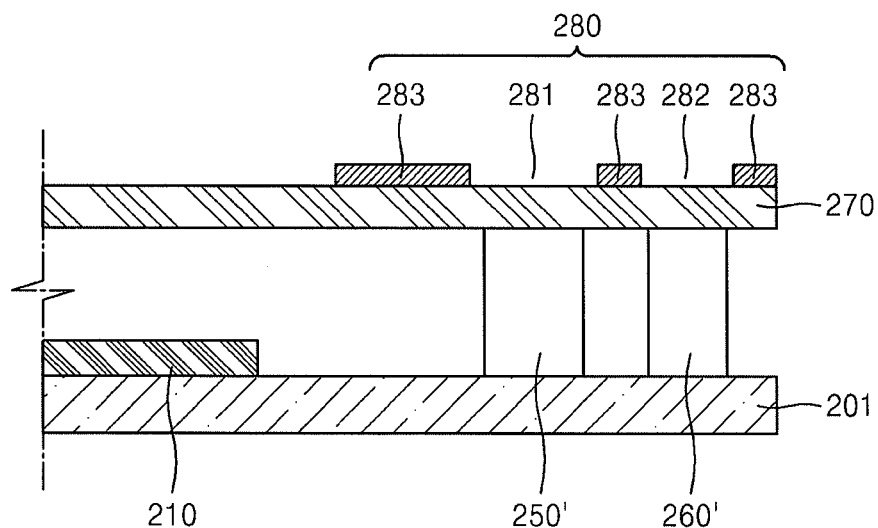

Referring to FIGS. 6B and 6C, the sealing substrate 270 is disposed facing the display unit 210. FIG. 6C is a magnified view of a portion A of FIG. 6B. A first preliminary sealing member 250' and a second preliminary sealing member 260' are formed between the substrate 201 and the sealing substrate 270 to be spaced apart from the display unit 210.

The first preliminary sealing member 250' contains frit. The first preliminary sealing member 250' is formed by applying a fit paste. Then, a curing and drying process is performed.

The second preliminary sealing member 260' contains resin. More particularly, the second preliminary sealing member 260' may contain epoxy resin.

The light pattern layer 280 is formed on an upper surface of the sealing substrate 270, i.e., a surface of the sealing substrate 270 opposite to a surface facing the display unit 210.

The light pattern layer 280 includes the first pattern 281, the second pattern 282, and the light blocking unit 283. The first pattern 281 is formed to correspond to the first preliminary sealing member 250'. The first pattern 281 has a width equal to or slightly greater than the width of the first preliminary sealing member 250'. The first pattern 281 is formed as an opening.

The second pattern 282 is formed to correspond to the second preliminary sealing member 260'. The second pattern 282 has a width equal to or slightly greater than the width of the second preliminary sealing member 260'. The second pattern 282 is formed as an opening.

The light blocking unit 283 is formed in a peripheral region of the first pattern 281 and a peripheral region of the second pattern 282. The first and second patterns 281 and 282 are spaced apart from each other. The light blocking unit 283 is also formed in the space between the first and second patterns 281 and 282. The light blocking unit 283 may contain metal. However, the light blocking unit 283 is not limited thereto. The light blocking unit 283 may contain various materials for blocking light. More particularly, the light blocking unit 283 may contain a laser beam.

Figure 6D:
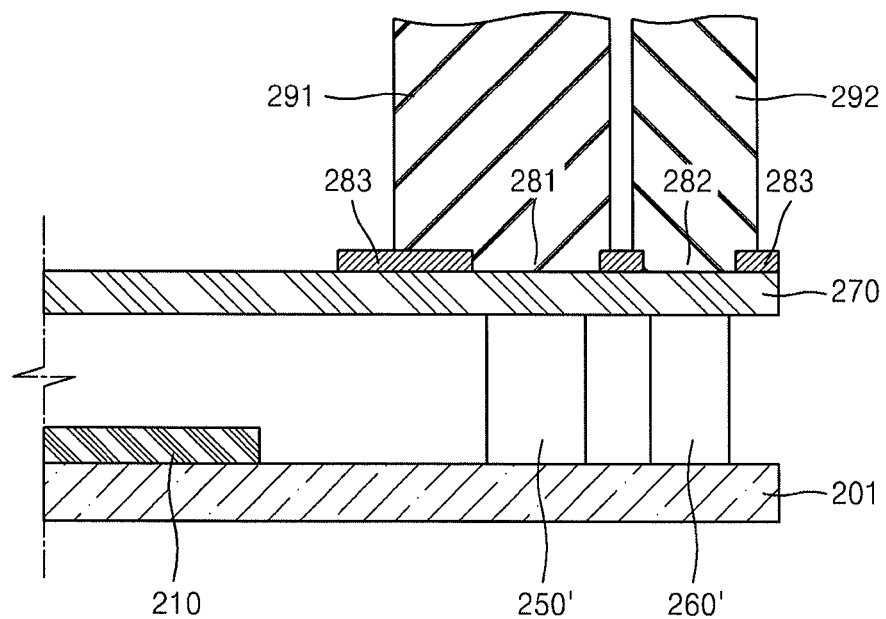

Referring to FIG. 6D, a first laser beam 291 and a second laser beam 292 are irradiated onto the upper surface of the sealing substrate 270. The first laser beam 291 is irradiated to correspond to a whole region of the first pattern 281. The first laser beam 291 in not irradiated to correspond to the second pattern 282. The second laser beam 292 is irradiated to correspond to a whole region of the second pattern 282. The second laser beam 292 is not irradiated to correspond to the first pattern 281. The first laser beam 291 has an energy value greater than the energy value of the second laser beam 292.

The first laser beam 291 is transmitted through the first pattern 281 formed as an opening, passes through the sealing substrate 270, and reaches the first preliminary sealing member 250'. The second laser beam 292 is transmitted through the second pattern 282 formed as an opening, passes through the sealing substrate 270, and reaches the second preliminary sealing member 260'. An energy value of the laser beam 290 received by the first preliminary sealing member 250' is greater than the energy value of the laser beam 290 received by the second preliminary sealing member 260'.

Energy received by the first preliminary sealing member 250' is greater than the energy received by the second preliminary sealing member 260'.

Energy required to melt frit contained in the first preliminary sealing member 250' is greater than the energy required to melt resin contained in the second preliminary sealing member 260'. Since the first laser beam 291 has a relatively high energy and the second laser beam 292 has a relatively low energy are irradiated through the first and second patterns 281 and 282, respectively, of the light pattern layer 280, the first preliminary sealing member 250' receives greater energy than the energy received by the second preliminary sealing member 260'.

The first and second laser beams 291 and 292 are irradiated simultaneously in FIG. 6D. However, the first and second laser beams 291 and 292 are not limited thereto. The first and second laser beams 291 and 292 may be sequentially irradiated. If there is a restriction for irradiating two laser beams with different energy values, the first and second laser beams 291 and 292 may be sequentially irradiated.

Figure 6E:
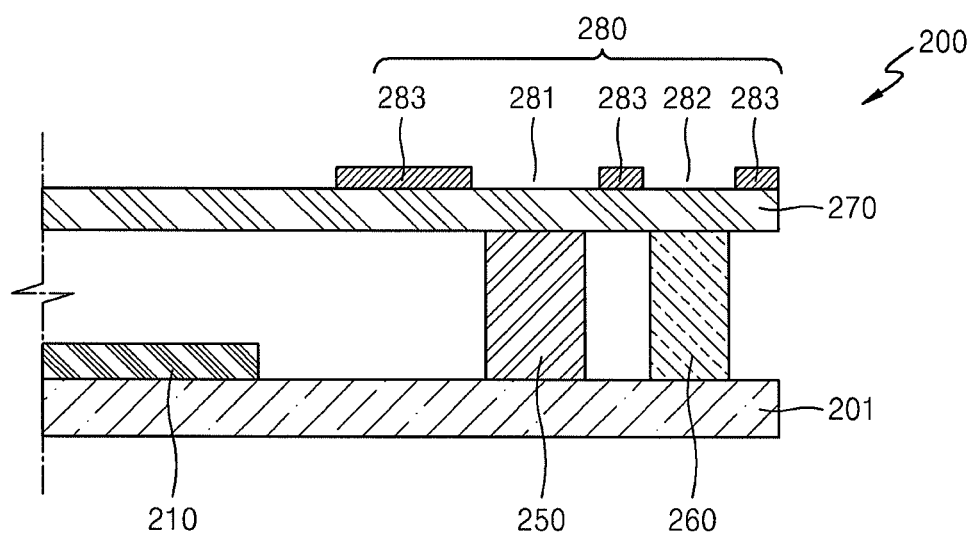

Referring to FIG. 6E, the first and second preliminary sealing members 250' and 260' are melted due to the irradiated first and second laser beams 291 and 292, and cured to form the first and second sealing members 250 and 260. The substrate 201 and the sealing substrate 270 are bonded to each other. The display apparatus 200 is ultimately formed.

The display apparatus 200, according to the current embodiment, includes the first and second sealing members 250 and 260. Since the second sealing member 260, containing resin, reinforces the first sealing member 250 containing frit, bonding characteristics between the substrate 201 and the sealing substrate 270 may be improved. Accordingly, the durability of the display apparatus 200 may be improved.

The display apparatus 200 may not require an additional mask to irradiate a laser beam in order to form the first and second sealing members 250 and 260. When a laser beam is irradiated, damages of the sealing substrate 270 caused by contact and alignment between a mask and the sealing substrate 270 may be prevented. Defects caused by an undesired irradiating pattern of a laser beam due to inaccurate alignment between a mask and the sealing substrate 270 may be prevented.

In a conventional flat panel display apparatus, a display unit is disposed between a substrate and a sealing substrate. The substrate and the sealing substrate are bonded to each other by a sealing member.

The sealing member is formed around the conventional display unit, to be spaced apart from the display unit. The sealing member is melted and cured by applied energy. Thus, the sealing member bonds the substrate and the sealing substrate to each other. Bonding characteristics between the substrate and the sealing substrate may be reduced. Thus, there may be a restriction in improving the durability of a display apparatus.

Present embodiments may provide a display apparatus, capable of improving durability. Present embodiments may also include a method of manufacturing the display apparatus.

Exemplary embodiments of the inventive concept have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. A display apparatus, comprising:
    a substrate;
    a sealing substrate facing the substrate;
    a display unit between the substrate and the sealing substrate;
    a first sealing member between the substrate and the sealing substrate, the first sealing member spaced apart from the display unit, the first sealing member bonding the substrate and the sealing substrate to each other;
    a second sealing member between the substrate and the sealing substrate, the second sealing member spaced apart from the display unit and the first sealing member, the second sealing member bonding the substrate and the sealing substrate to each other; and
    a light pattern layer on a surface of the sealing substrate, opposite to a surface facing the display unit, the light pattern layer adjusting light intensity transmitted through the sealing substrate, wherein the light pattern layer includes a first pattern corresponding to the first sealing member and a second pattern corresponding to the second sealing member, wherein:
    the first pattern transmits a first amount of light,
    the second pattern transmits a second amount of light different from the first amount of light, and
    the light pattern layer includes at least one light blocking pattern between the first and second patterns.

2. The display apparatus as claimed in claim 1, wherein the at least one light blocking pattern includes a first light blocking pattern in a peripheral region of the first pattern and a second light blocking pattern in a peripheral region of the second pattern.

3. The display apparatus as claimed in claim 1, wherein the first pattern has a first width and the second pattern has a second width are spaced apart from each other.

4. The display apparatus as claimed in claim 1, wherein:
    the first pattern is an opening.

5. The display apparatus as claimed in claim 1, wherein:
    the second pattern is a semi light-transmissive pattern for partially transmitting light incident on the sealing substrate.

6. The display apparatus as claimed in claim 5, wherein:
    the second pattern includes slits or includes a semi light-transmissive material.

7. The display apparatus as claimed in claim 1, wherein:
    the second pattern is an opening.

8. The display apparatus as claimed in claim 1, wherein:
    the first sealing member includes frit, and
    the second sealing member includes resin.

9. The display apparatus as claimed in claim 1, wherein:
    the second sealing member is spaced apart from the display unit by a distance greater than a distance by which the first sealing member is spaced apart from the display unit.

10. The display apparatus as claimed in claim 1, wherein:
    the display unit includes an organic light-emitting device or a liquid crystal device.

11. A method of manufacturing a display apparatus, the method comprising:
    disposing a display unit between a substrate and a sealing substrate facing the substrate;
    disposing, between the substrate and the sealing substrate, a first preliminary sealing member spaced apart from the display unit, and a second preliminary sealing member spaced apart from the display unit and the first preliminary sealing member; and
    irradiating a laser beam onto an upper surface of the sealing substrate, to melt and cure the first and second preliminary sealing members, to form first and second sealing members, and to bond the substrate and the sealing substrate to each other, wherein a light pattern layer, including a first pattern corresponding to the first preliminary sealing member and a second pattern corresponding to the second preliminary sealing member, is on a surface of the sealing substrate facing the laser beam, wherein the first pattern transmits a first amount of light and the second pattern transmits a second amount of light different from the first amount of light, and wherein the light pattern layer includes at least one light blocking pattern between the first and second patterns.

12. The method as claimed in claim 11, the light pattern layer further comprising: a light blocking unit in a peripheral region of the first pattern and a peripheral region of the second pattern.

13. The method as claimed in claim 11, the light pattern layer further comprising:
    a light blocking unit in a region between the first pattern and the second pattern,
    wherein the first pattern and the second pattern are spaced apart from each other.

14. The method as claimed in claim 11, wherein:
    the first pattern is an opening.

15. The method as claimed in claim 11, wherein:
    the second pattern is a semi light-transmissive pattern for partially transmitting light incident on the sealing substrate.

16. The method as claimed in claim 11, wherein:
    the second pattern includes slits or includes a semi light-transmissive material.

17. The method as claimed in claim 11, wherein:
    irradiating the laser beam includes irradiating a laser beam corresponding to a whole region of the first pattern and the second pattern.

18. The method as claimed in claim 11, wherein:
    the second pattern is an opening.

19. The method as claimed in claim 11, wherein:
    irradiating the laser beam includes irradiating a laser beam, corresponding to the first pattern and irradiating a laser beam, corresponding to the second pattern.

20. The method as claimed in claim 11, wherein:
    the first sealing member includes frit, and
    the second sealing member includes resin.

21. The method as claimed in claim 11, wherein:
    the second sealing member is spaced apart from the display unit by a distance greater than a distance by which the first sealing member is spaced apart from the display unit.

22. The method as claimed in claim 11, wherein:
    the display unit includes an organic light-emitting device or a liquid crystal device.

23. The display apparatus as claimed in claim 1, wherein:
the first pattern allows a first energy value of a laser beam to be received by the first sealing member, and
the second pattern allows a second energy value of the laser beam to be received by the second sealing member.

24. The display apparatus as claimed in claim 1, wherein:
the first pattern is an opening, and
the second pattern includes a plurality of holes or slits that transmits the second amount of light.

* * * * *